(12) United States Patent
Nishii et al.

(10) Patent No.: US 9,548,204 B2
(45) Date of Patent: Jan. 17, 2017

(54) SEMICONDUCTOR DEVICE, MANUFACTURING METHOD OF THE SAME AND METHOD OF SUPPRESSING DECREASE OF FLAT BAND VOLTAGE

(71) Applicant: TOYODA GOSEI CO., LTD., Kiyosu-shi (JP)

(72) Inventors: Junya Nishii, Kiyosu (JP); Tohru Oka, Kiyosu (JP)

(73) Assignee: TOYODA GOSEI CO., LTD., Kiyosu-Shi, Aichi-Ken (JP)

(*) Notice: Subject to any disclaimer, the term of this patent is extended or adjusted under 35 U.S.C. 154(b) by 0 days.

(21) Appl. No.: 14/843,614

(22) Filed: Sep. 2, 2015

(65) Prior Publication Data

US 2016/0071732 A1 Mar. 10, 2016

(30) Foreign Application Priority Data

Sep. 4, 2014 (JP) ................. 2014-180084

(51) Int. Cl.
| | |
|---|---|
| H01L 29/66 | (2006.01) |
| H01L 21/28 | (2006.01) |
| H01L 21/02 | (2006.01) |
| H01L 29/49 | (2006.01) |
| H01L 29/778 | (2006.01) |
| H01L 29/78 | (2006.01) |
| H01L 29/423 | (2006.01) |
| H01L 29/20 | (2006.01) |

(52) U.S. Cl.
CPC ...... *H01L 21/28264* (2013.01); *H01L 21/0228* (2013.01); *H01L 29/4966* (2013.01); *H01L 29/66462* (2013.01); *H01L 29/7786* (2013.01); *H01L 29/7813* (2013.01); *H01L 29/2003* (2013.01); *H01L 29/4236* (2013.01)

(58) Field of Classification Search
CPC .............. H01L 21/28264; H01L 29/66462; H01L 29/4966; H01L 29/7813; H01L 29/2003; H01L 29/4236
USPC ....................... 257/192, 330, 332
See application file for complete search history.

(56) References Cited

U.S. PATENT DOCUMENTS

| | | | |
|---|---|---|---|
| 8,350,292 B2 * | 1/2013 | Nishikawa | ......... H01L 29/7783 257/192 |
| 2013/0032819 A1 | 2/2013 | Kambayashi et al. | |
| 2013/0292700 A1 | 11/2013 | Teramoto et al. | |

FOREIGN PATENT DOCUMENTS

| | | |
|---|---|---|
| JP | 2009-076673 A | 4/2009 |
| JP | 2012-156245 A | 8/2012 |
| JP | 5506036 B2 | 5/2014 |

OTHER PUBLICATIONS

Phys. Status Solidi B247, No. 7, 1649-1652 (2010) "Study of the flat band voltage shift of Metal/insulator/n-GaN capacitors by annealing".

* cited by examiner

*Primary Examiner* — Tan N Tran
(74) *Attorney, Agent, or Firm* — McGinn IP Law Group, PLLC (57) ABSTRACT

There is provided a semiconductor device comprising a semiconductor layer that is made of a gallium-containing group III-V compound; and a first insulating film that is in contact with the semiconductor layer and contains silicon. An average density of gallium in the first insulating film between an interface of the first insulating film and the semiconductor layer and a plane away from the interface by 30 nm is less than $1.0 \times 10^{18}$ cm$^{-3}$. This configuration suppresses a decrease in flat band voltage and a decrease in threshold voltage.

16 Claims, 7 Drawing Sheets

| Heat Treatment | Interface State Density |
|---|---|
| 400 | $2.8 \times 10^{11}$ |
| 500 | $1.0 \times 10^{11}$ |
| 600 | $1.4 \times 10^{11}$ |
| 650 | $3.6 \times 10^{11}$ |
| 700 | $1.1 \times 10^{12}$ |
| 750 | $8.9 \times 10^{11}$ |
| 800 | $5.9 \times 10^{11}$ |

| Heat Treatment Temperature (°C) | Ga Concentration (cm$^{-3}$) | Variation in Vfb (ΔVfb) |
|---|---|---|
| No Heat Treatment | Below Detection Limit | — |
| 400 | Below Detection Limit | Basis |
| 500 | Below Detection Limit | 0.2 |
| 600 | 1.2 × 10$^{18}$ | −1.2 |
| 650 | — | −1.8 |
| 700 | 2.6 × 10$^{19}$ | −3.9 |
| 750 | — | −5.8 |
| 800 | 3.3 × 10$^{19}$ | −7.6 |

SEMICONDUCTOR DEVICE, MANUFACTURING METHOD OF THE SAME AND METHOD OF SUPPRESSING DECREASE OF FLAT BAND VOLTAGE

CROSS-REFERENCE TO RELATED APPLICATION

The present application claims priority from Japanese patent applications No. 2014-180084 filed on Sep. 4, 2014, the entirety of disclosures of which is hereby incorporated by reference into this application.

FIELD

The present invention relates to a semiconductor device.

RELATED ART

A conventionally known semiconductor device is an MIS (metal insulator semiconductor)-type semiconductor device. In the case of manufacturing the MIS-type semiconductor device from a semiconductor that is unlikely to form a good insulating film by thermal oxidation (for example, gallium nitride (GaN) or gallium arsenide (GaAs)), there is a need to form an insulating film by deposition such as CVD (chemical vapor deposition) method or PVD (physical vapor deposition) method.

In the case of using an insulating film formed by deposition, a known technique performs heat treatment (thermal process) after formation of the insulating film for the purpose of improving the insulating properties of the insulating film or more specifically for the purpose of reducing the interface state density at an interface of a semiconductor layer and the insulating film. For example, JP 2009-76673A describes the necessity of heat treatment at 900° C. for 20 minutes.

SUMMARY

The heat treatment at high temperature may, however, cause a decrease in flat band voltage (Vfb) and a decrease in threshold voltage (Vth) of the semiconductor device. According to Phys. Status Solidi B247, No. 7, 1649-1652 (2010) "Study of the flat band voltage shift of Metal/insulator/n-GaN capacitors by annealing", alignment of the directions of electric dipoles at the interface of the semiconductor layer and the insulating film is discussed as the possible reason of such decreases, but the details are still unknown.

As the result of the decrease in flat band voltage (Vfb) and the decrease in threshold voltage (Vth), the threshold voltage may have a negative value, and the semiconductor device may be a normally-on type (depression type). A normally-off type (enhancement type) is, however, desired for the semiconductor device used in power circuits of automobiles, home electric appliances and the like.

Accordingly, an object of the invention is to suppress a decrease in flat band voltage (Vfb) and suppress a decrease in threshold voltage (Vth). Another object of the invention is to reduce the interface state density at an interface of a semiconductor layer and an insulating layer.

In order to solve at least part of the problems described above, the invention may be implemented by the following aspects.

(1) According to one aspect of the invention, there is provided a semiconductor device. The semiconductor has a semiconductor layer that is made of a gallium-containing group III-V compound; and a first insulating film that is in contact with the semiconductor layer and contains silicon, wherein an average density of gallium in the first insulating film between an interface of the first insulating film and the semiconductor layer and a plane away from the interface by 30 nm is less than $1.0 \times 10^{18}$ cm$^{-3}$. The semiconductor device according to this aspect suppresses a decrease in flat band voltage and a decrease in threshold voltage.

(2) In the semiconductor device of the above aspect, the semiconductor layer may be made of a gallium-containing group III nitride.

(3) In the semiconductor device of the above aspect, the first insulating film may be made of at least one selected from the group consisting of silicon oxide, silicon nitride and silicon oxynitride.

(4) In the semiconductor device of the above aspect, an interface state density at an interface of the semiconductor layer and the first insulating film may be not higher than $3.0 \times 10^{11}$ cm$^{-2}$eV$^{-1}$.

(5) According to one embodiment, the semiconductor device of the above aspect may further comprise a second insulating film that is provided on an opposite side of the first insulating film to the semiconductor layer and is made of a different material from material of the first insulating film.

(6) In the semiconductor device of the above aspect, the second insulating film may have a higher permittivity than the first insulating film. In the semiconductor device according to this aspect, the second insulating film has the higher permittivity than the first insulating film. This is more likely to induce the carrier in the semiconductor layer that is in contact with the first insulating film.

(7) In the semiconductor device of the above aspect, the second insulating film may be made of at least one selected from the group consisting of zirconium oxide, zirconium oxynitride, hafnium oxide and hafnium oxynitride.

(8) In the semiconductor device of the above aspect, the second insulating film may be made of at least one selected from the group consisting of aluminum oxide, aluminum nitride and aluminum oxynitride.

(9) According to one embodiment, the semiconductor device of the above aspect may further comprise a first metal layer provided on an opposite side of the first insulating layer to the semiconductor layer, so as to form an MIS structure.

(10) In the semiconductor device of the above aspect, the first metal layer may be made of titanium nitride and has a composition ratio of nitrogen to titanium (nitrogen/titanium) between 0.88 and 0.98, inclusive.

(11) According to one embodiment, the semiconductor device of the above aspect may further comprise a second metal layer provided on an opposite side of the first metal layer to the semiconductor layer, and the second metal layer may be made of an aluminum alloy.

(12) According to one embodiment, the semiconductor device of the above aspect may further comprise a third metal layer provided on an opposite side of the second metal layer to the semiconductor layer, and the third metal layer may be made of titanium nitride.

(13) According to one embodiment, the semiconductor device of the above aspect may be an insulating gate-type field effect transistor, in which a gate electrode may form at least part of the MIS structure.

(14) In the semiconductor device of the above aspect, the semiconductor layer may include a first semiconductor layer, and a second semiconductor layer that is stacked on the first semiconductor layer and is made of a different material from material of the first semiconductor layer, wherein a two-dimensional electron gas may be present at an interface of the first semiconductor layer and the second semiconductor layer.

(15) According to one embodiment, the semiconductor device of the above aspect may further comprise a trench, wherein the MIS structure may be formed on a wall of the trench.

(16) According to one embodiment, the semiconductor device of the above aspect may be a vertical transistor.

(17) According to another aspect of the invention, there is provided a manufacturing method of a semiconductor device. The manufacturing method of the semiconductor device has a first process of forming a first insulating film that contains silicon on a semiconductor layer that is made of gallium-containing group III-V compound; and a heat treatment process of performing heat treatment at temperature of lower than 600° C. after the first process. The manufacturing method of the semiconductor device according to this aspect suppresses a decrease in flat band voltage and a decrease in threshold voltage of the semiconductor device.

(18) In the manufacturing method of the semiconductor device of above aspect, a film-forming temperature in the first process may be lower than 600° C.

(19) According to one embodiment, the manufacturing method of the semiconductor device of above aspect may further comprise a second process of forming a metal layer on an opposite side of the first insulating film to the semiconductor layer, after the first process and before the heat treatment process.

(20) In the manufacturing method of the semiconductor device of above aspect, the first process may form the first insulating film by atomic layer deposition. The manufacturing method of the semiconductor device according to this aspect reduces the interface state density of the semiconductor device.

(21) In the manufacturing method of the semiconductor device of above aspect, the heat treatment process may be performed at temperature of not lower than 400° C.

(22) According to another aspect of the invention, there is provided a method of suppressing a decrease in flat band voltage of a semiconductor device in which a first insulating film that contains silicon is formed on a semiconductor layer that is made of a gallium-containing group III-V compound. The method has a process of performing heat treatment of the semiconductor device at temperature of lower than 600° C., so as to reduce an interface state density at an interface of the semiconductor layer and the first insulating film. The method according to this aspect achieves reduction of the interface state density at the interface of the semiconductor layer and the first insulating film, as well as suppression of a decrease in flat band voltage and suppression of a decrease in threshold voltage.

The present invention may be actualized by a variety of aspects other than those described above, for example, an electric appliance with the semiconductor device of any of the above aspects incorporated therein or a manufacturing apparatus configured to manufacture the semiconductor device of any of the above aspect.

The semiconductor device of any of the above aspects of the invention suppresses a decrease in flat band voltage and a decrease in threshold voltage.

DESCRIPTION OF EMBODIMENTS

A. First Embodiment

A1. Structure of Semiconductor Device

Figure 1:
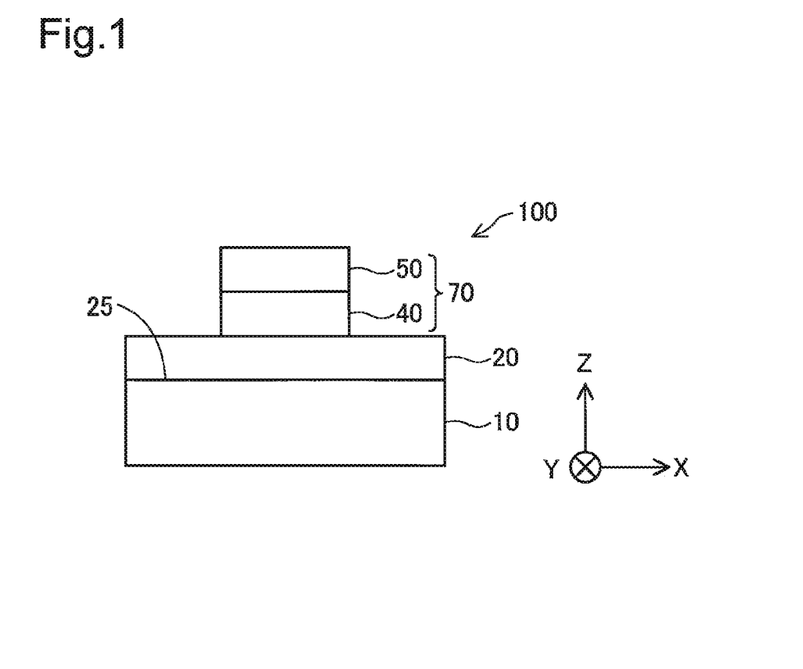
FIG. 1 is a sectional view schematically illustrating the structure of a semiconductor device according to a first embodiment.

FIG. 1 is a sectional view schematically illustrating the structure of a semiconductor device 100 according to a first embodiment. According to this embodiment, the semiconductor device 100 is an MIS (metal insulator semiconductor) diode. XYZ axes orthogonal to one another are illustrated in FIG. 1.

Among the XYZ axes in FIG. 1, the X axis is an axis going from the left side of the sheet surface to the right side of the sheet surface of FIG. 1; +X-axis direction is a direction going rightward on the sheet surface and −X-axis direction is a direction going leftward on the sheet surface. Among the XYZ axes in FIG. 1, the Y axis is an axis going from the front side of the sheet surface to the rear side of the sheet surface of FIG. 1; +Y-axis direction is a direction going backward on the sheet surface and −Y-axis direction is a direction going forward on the sheet surface. Among the XYZ axes in FIG. 1, the Z axis is an axis going from the lower side of the sheet surface to the upper side of the sheet surface of FIG. 1; +Z-axis direction is a direction going upward on the sheet surface and −Z-axis direction is a direction going downward on the sheet surface.

The semiconductor device 100 includes a semiconductor layer 10 (also called semiconductor substrate 10), a first insulating film 20, and a metal layer 70. The metal layer 70 includes a first metal layer 40 and a second metal layer 50.

The semiconductor layer 10 of the semiconductor device 100 is a plate-like semiconductor layer extended along both the X axis and the Y axis. The semiconductor layer 10 is made of a gallium-containing group III-V compound. The "gallium-containing group III-V compound" is, for example, a gallium-containing group III nitride. Other examples of the "gallium-containing group III-V compound" include aluminum gallium arsenide (AlGaAs), aluminum gallium phosphide (AlGaP), indium gallium antimonide (InGaSb) and aluminum gallium arsenide nitride (AlGaAsN).

Examples of the "gallium-containing group III nitride" include gallium nitride (GaN), aluminum gallium nitride (AlGaN), indium gallium nitride (InGaN) and aluminum gallium indium nitride (AlGaInN). According to this embodiment, the semiconductor layer 10 is made of gallium nitride (GaN).

The first insulating film 20 of the semiconductor device 100 is in contact with the semiconductor layer 10 and contains silicon. The silicon-containing insulating film may be, for example, an insulating film made of at least one selected from the group consisting of silicon oxide, silicon nitride and silicon oxynitride. The "silicon oxide, nitride and oxynitride" means silicon oxide, silicon nitride and silicon oxynitride. According to this embodiment, the first insulating film 20 is made of silicon dioxide (SiO$_2$). The first insulating film 20 preferably has a film thickness of not less than 5 nm. The film thickness of the first insulating film 20 is preferably not greater than 50 nm and is more preferably not greater than 30 nm.

The average concentration of gallium in the first insulating film 20 or more specifically the average concentration of gallium between an interface 25 of the semiconductor layer 10 and the first insulating film 20 and a plane in the first insulating film 20 away from the interface 25 by 30 nm is less than $1.0 \times 10^{18}$ cm$^{-3}$. This suppresses a decrease in flat band voltage Vgb and a decrease in threshold voltage Vth. A method employed to measure the average concentration of gallium will be described later. The interface state density at the interface of the semiconductor layer 10 and the first insulating film 20 is preferably not higher than $3.0 \times 10^{11}$ cm$^{-2}$eV$^{-1}$, is more preferably not higher than $1.5 \times 10^{11}$ cm$^{-2}$eV$^{-1}$ and is furthermore preferably not higher than $1.0 \times 10^{11}$ cm$^{-2}$eV$^{-1}$.

The metal layer 70 of the semiconductor device 100 is provided on the opposite side of the first insulating film 20 to the semiconductor layer 10. The metal layer 70 includes the first metal layer 40 and the second metal layer 50 formed sequentially from the semiconductor layer 10-side. The semiconductor device 100 has the MIS structure formed by the semiconductor layer 10, the first insulating film 20 and the metal layer 70.

The first metal layer 40 is made of titanium nitride (TIN). According to this embodiment, the composition ratio of nitrogen to titanium (nitrogen/titanium) of the first metal layer 40 is between 0.88 and 0.98, inclusive. Such composition ratio suppresses a variation in flat band voltage Vfb according to a variation in thickness of the titanium nitride layer. The atomic composition of nitrogen and titanium at the composition ratio (nitrogen/titanium) is measured by Rutherford backscattering spectrometry (RBS). The description of Japanese patent application No. 2014-024248 may be referred to with regard to the control method of the composition ratio (nitrogen/titanium).

The second metal layer 50 is located on the opposite side of the first metal layer 40 to the semiconductor layer 10. The second metal layer 50 is made of an aluminum alloy.

A2. Manufacturing Method of Semiconductor Device

Figure 2:
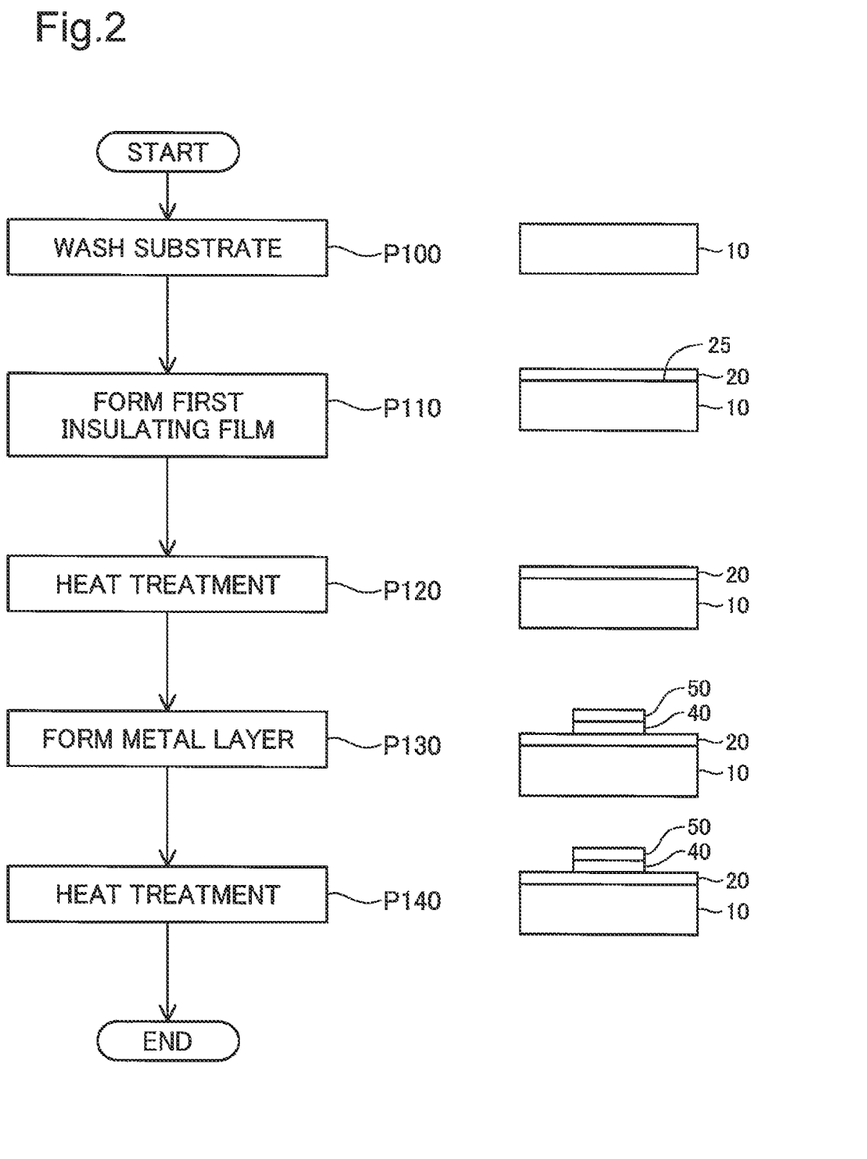
FIG. 2 is a flowchart showing a manufacturing method of the semiconductor device.

FIG. 2 is a flowchart showing a manufacturing method of the semiconductor device 100. In manufacture of the semiconductor device 100, the manufacturer provides the semiconductor substrate 10 and washes the semiconductor substrate 10 with an organic solvent (for example, acetone) and an acid for removal of foreign substances and the like adhering to the surface of the semiconductor substrate 10 at process P10.

After washing the substrate (process P100), the manufacturer forms the first insulating film 20 on the semiconductor layer 10 at process P110. More specifically, immediately after washing the semiconductor substrate 10, the manufacturer conveys the semiconductor substrate 10 into an ALD (atomic layer deposition) apparatus.

The manufacturer subsequently heats the semiconductor substrate 10 to a temperature of about 350° C. and forms the first insulating film 20 by ozone oxidation or plasma oxidation using an organic metal as the raw material of silicone. The first insulating film 20 is a film of silicon dioxide (SiO2). According to this embodiment, the first insulating film 20 has a film thickness of 50 nm. The film-forming temperature in the process of forming the first insulating film 20 is lower than 600° C. The film-forming temperature is preferably not higher than 500° C. and is more preferably not higher than 400° C., in terms of suppressing the decrease of the flat band voltage Vfb.

The first insulating film 20 is formed by ALD (atomic layer deposition) method according to this embodiment, but may be formed by CVD (chemical vapor deposition) method or PVD (physical vapor deposition) method. The ALD method is, however, preferable, since the ALD method reduces the interface state density at an interface of the semiconductor layer 10 and the first insulating film 20, compared with the CVD method and the PVD method.

After forming the first insulating film 20 (process P110), the manufacturer performs heat treatment at temperature of lower than 600° C. at process P120. This heat treatment reduces the interface state density at the interface of the semiconductor layer 10 and the first insulating film 20. According to this embodiment, the heat treatment is performed in a nitrogen atmosphere for a heat treatment time of 30 minutes.

The heat treatment at the temperature of lower than 600° C. suppresses the decrease of the flat band voltage Vfb and the decrease of the threshold voltage Vth. The heat treatment temperature is preferably not higher than 550° C. and is more preferably not higher than 500° C., in terms of further suppresses the decrease of the flat band voltage Vfb and the decrease of the threshold voltage Vth. The heat treatment temperature is, on the other hand, preferably not lower than 400° C. and is more preferably not lower than 450° C., in terms of further reducing the interface state density at the interface of the semiconductor layer 10 and the first insulating film 20.

After the heat treatment (process P120), the manufacturer forms the metal layer 70 on the opposite side of the first insulating film 20 to the semiconductor layer 10 at process P130. Specifically, the manufacturer forms the first metal layer 40 made of titanium nitride and the second metal layer 50 made of the aluminum alloy sequentially from the semiconductor layer 10-side.

More specifically, the manufacturer first forms a titanium nitride (TiN) layer and an aluminum (Al) layer on the first insulating film 20 by sputtering. The manufacturer subsequently forms a resist mask on the aluminum layer by photolithography. The manufacturer then dry etches unrequired parts of the titanium nitride (TiN) layer and the aluminum (Al) layer by ICP-RIE (inductively coupled plasma reactive ion etching), and finally removes the resist mask.

After formation of the metal layer 70 (process P130), the manufacturer performs heat treatment for alloying the metal layer 70 at process P140. According to this embodiment, the heat treatment is performed in a nitrogen atmosphere at a heat treatment temperature of 400° C. for a heat treatment time of 30 minutes.

The semiconductor device 100 is completed by the series of these processes.

According to this embodiment, the heat treatment process is performed twice (process P120 and P140). According to another embodiment, however, the heat treatment at process P120 may be omitted, while the heat treatment at only process P140 may be performed. In this modification, after formation of the first insulating film 20 (process P110), the manufacturer may form the metal layer 70 prior to the heat treatment process (process P140). In this case, the heat treatment at process P140 is performed for the purpose of reducing the interface state density at the interface of the semiconductor layer 10 and the first insulating film 20. The method according to this embodiment includes the process of performing heat treatment at the temperature of lower than 600° C. for the purpose of reducing the interface state density at the interface of the semiconductor layer 10 and the first insulating film 20, as the technique for suppressing the decrease of the flat band voltage Vfb of the semiconductor device 100. This method achieves reduction of the interface state density at the interface of the semiconductor layer and the first insulating film, as well as suppression of a decrease in flat band voltage and suppression of a decrease in threshold voltage.

B. Evaluation Tests

B1. Evaluation of Electric Characteristic of MIS Diode

Figure 3:
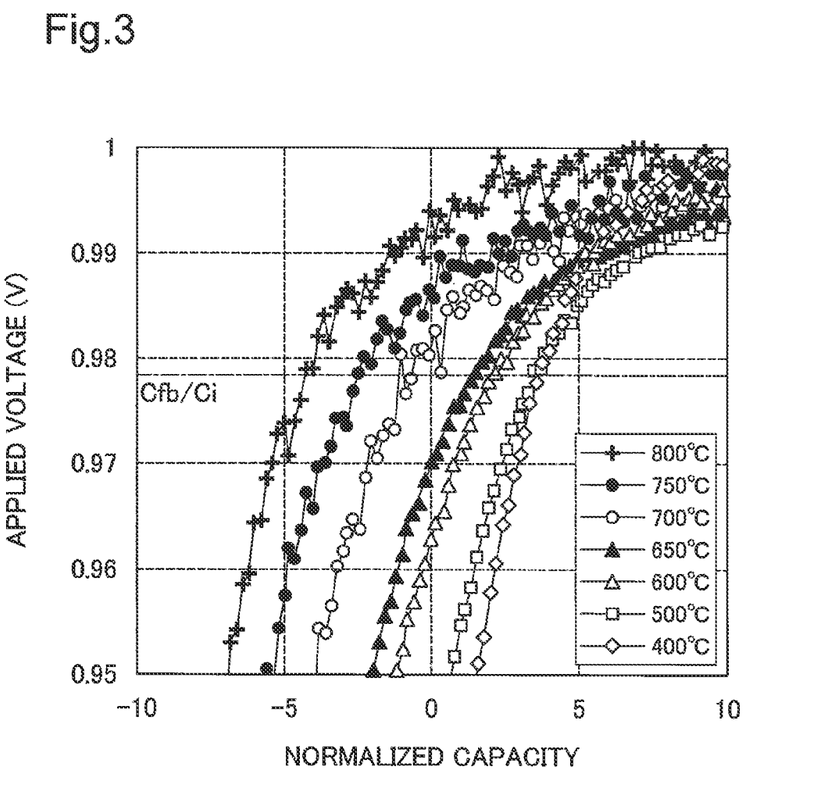
FIG. 3 is a graph showing the electric characteristics of MIS diodes

FIG. 3 is a graph showing the electric characteristics of MIS diodes. In the evaluation test of FIG. 3, a plurality of test samples described below were provided as semiconductor devices.

Each test sample was produced by the following procedure. The examiner formed an insulating film of silicon dioxide ($SiO_2$) (film thickness of 50 nm) on a semiconductor substrate made of gallium nitride (GaN) by the ALD method.

The examiner subsequently performed heat treatment at various different temperatures for 30 minutes. More specifically, seven different patterns, i.e., 400° C., 500° C., 600° C., 650° C., 700° C., 750° C. and 800° C. were set as the heat treatment temperature. The heat treatment was performed in a nitrogen atmosphere. The lamp heating technique was employed for heat treatment in this experiment, but another heating technique, for example, a heating method using an electric furnace may be employed.

After the heat treatment, the examiner formed a titanium nitride layer (film thickness of 40 nm) and an aluminum layer (film thickness of 600 nm) in this sequence as a gate electrode on the insulating film. The gate electrode was formed by sputtering. The examiner then dry etched the gate electrode to a columnar shape of 200 μm in diameter.

The examiner measured the CV characteristic by supplying electric current to the gate electrode and a surface of the semiconductor on the opposite side to the surface that is in contact with the gate electrode. The interface state density and the fixed charge density were calculated by Terman method. FIG. 3 shows the capacity normalized by the insulating film capacity (Ci) as ordinate and the applied voltage as abscissa. In this test, the flat band voltage Vfb denotes a voltage at the normalized capacity of Cfb/Ci=0.978. This value is calculated by using, for example, the carrier concentration of the semiconductor.

According to the results of FIG. 3, the test sample subjected to heat treatment at 400° C. and the test sample subjected to heat treatment at 500° C. have substantially equal flat band voltages Vfb. The flat band voltage Vfb of the test sample subjected to heat treatment at 600° C. or higher temperature is, however, significantly lower than the flat band voltage Vfb of the test sample subjected to heat treatment at 400° C. These results of FIG. 3 show that the heat treatment at 600° C. or higher temperature decreases the flat band voltage Vfb.

Figure 4:
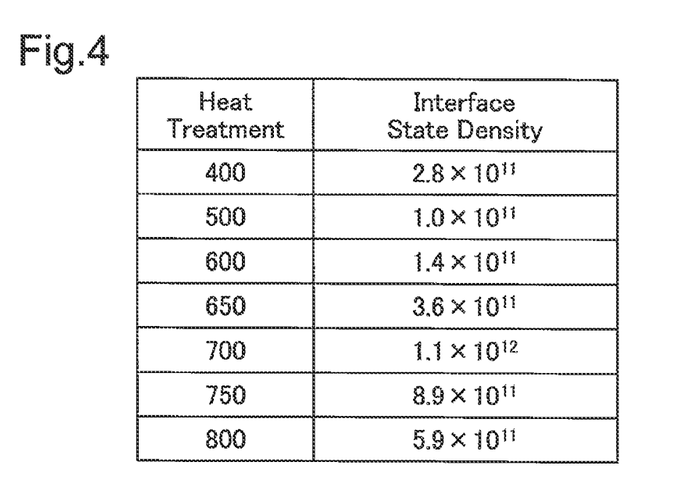
FIG. 4 is a table showing the interface state densities of respective test samples.

FIG. 4 is a table showing the interface state densities of the respective test samples. With regard to all the test samples, the interface state density is in a range of about $1.0 \times 10^{11}$ $cm^{-2}eV^{-1}$ to about $1.0 \times 10^{12}$ $cm^{-2}eV^{-1}$. The results of FIG. 4 show that the interface state density is not significantly affected by the heat treatment temperature as long as the heat treatment temperature is not lower than 400° C. The value in the range of $1.0 \times 10^{11}$ $cm^{-2}eV^{-1}$ to about $1.0 \times 10^{12}$ $cm^{-2}eV^{-1}$ indicates the favorable insulating characteristic.

B2. Analysis of Gallium Concentration in Insulating Film

Figure 5:
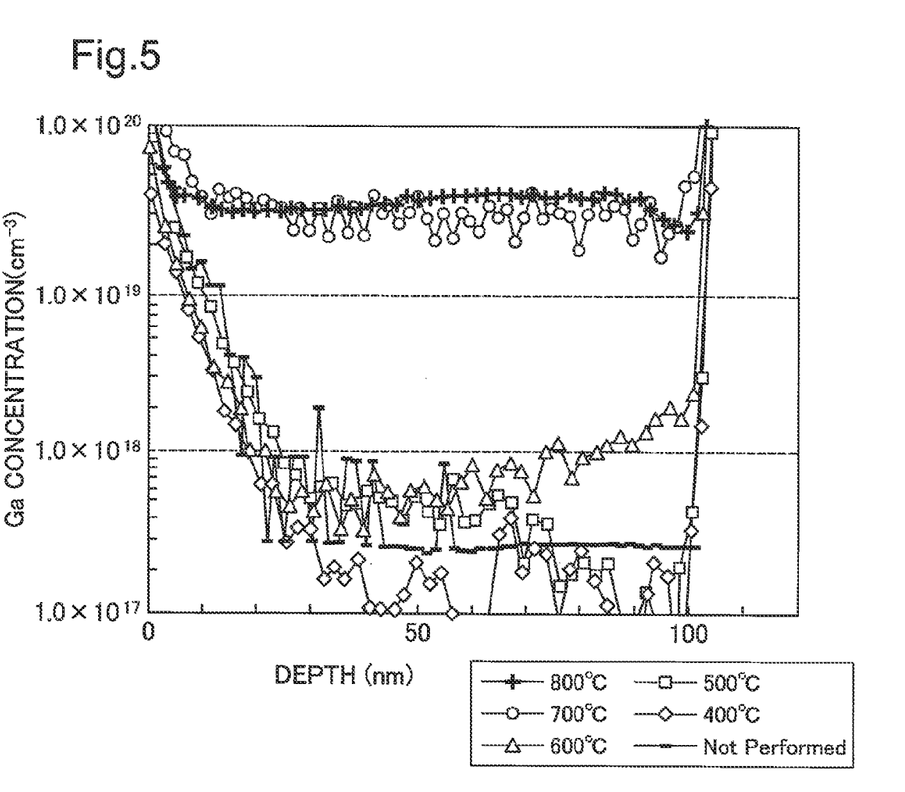
FIG. 5 is a graph showing gallium concentrations in insulating films.

FIG. 5 is a graph showing gallium concentrations in the insulating films. This graph shows the results obtained by SIMS (secondary ion mass spectrometry). In the test of FIG. 5, a plurality of test samples described below were provided as semiconductor devices.

The examiner first formed an insulating film of silicon dioxide ($SiO2$) (film thickness of 100 nm) on a semiconductor substrate made of gallium nitride by the ALD method. The examiner subsequently performed heat treatment at various different temperatures for 30 minutes. More specifically, five different patterns, i.e., 400° C., 500° C., 600° C., 700° C. and 800° C. were set as the heat treatment temperature. The heat treatment was performed in a nitrogen atmosphere.

The graph of FIG. 5 shows the gallium concentration as ordinate and the depth from the surface of the insulating film as abscissa. The point at the depth of 0 nm indicates the surface of the insulating film, and the point at the depth of 100 nm indicates the interface of the insulating film and the semiconductor substrate. The gallium concentration from the surface of the insulating film to about 30 nm (i.e., at the depth of 0 nm to about 30 nm) does not show the actual gallium concentration, due to the effect of surface contamination. The detection limit of this analysis is about $3.0 \times 10^{17}$ $cm^{-3}$.

The gallium concentrations of the test sample subjected to heat treatment at 400° C. and the test sample subjected to heat treatment at 500° C. are below the detection limit. This indicates no significant diffusion of gallium into the insulating film. The test sample subjected to heat treatment at 600° C. has the gallium concentration of about $1.0 \times 10^{18}$ $cm^{-3}$ between the interface of the insulating film and the semiconductor substrate (point at the depth of 100 nm) and a plane in the insulating film away from the interface by 30 nm (point at the depth of 70 m). With regard to the test sample subjected to heat treatment at 600° C., the results of FIG. 5 show that the gallium concentration gradually decreases from the interface of the insulating film and the semiconductor substrate (point at the depth of 100 nm) to the plane in the insulating film away from the interface by 30 nm (point at the depth of 70 m). This indicates diffusion of gallium from the semiconductor substrate into the insulating film by heat.

The test sample subjected to heat treatment at 700° C. and the test sample subjected to heat treatment at 800° C. have substantially fixed gallium concentrations of about $4.0 \times 10^{19}$ cm$^{-3}$ in the insulating film. This indicates diffusion of gallium to the surface of the insulating film and homogeneous distribution of gallium in the insulating film.

B3. Relationship between Gallium Concentration and Flag Band Voltage Vfb

Figure 6:
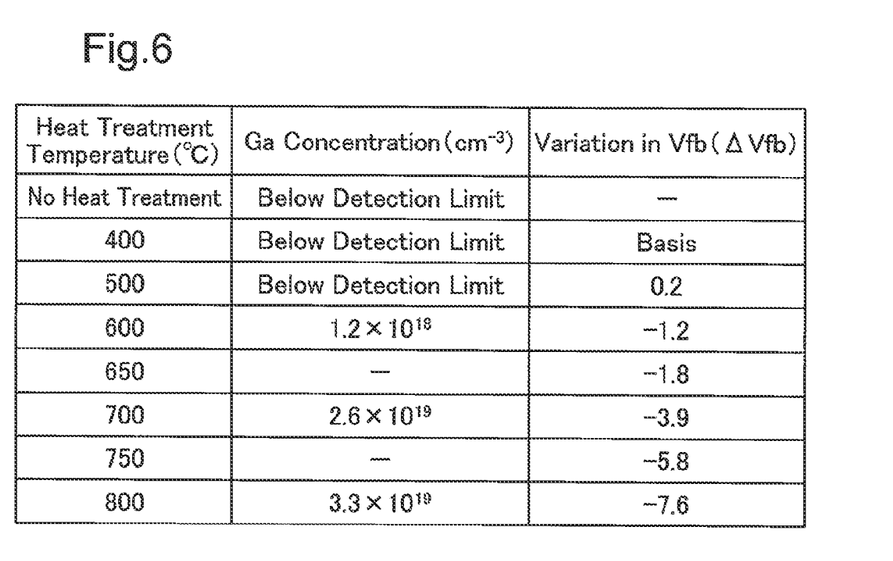
FIG. 6 is a table showing the relationship between the gallium concentration in the insulating film and a variation in flat band voltage Vfb with regard to respective heat treatment temperatures.

FIG. 6 is a table showing the relationship between the gallium concentration in the insulating film and a variation ΔVfb in flat band voltage Vfb with regard to respective heat treatment temperatures. In this table, the gallium concentration in the insulating film is an average concentration of gallium between the interface of the insulating film and the semiconductor substrate (point at the depth of 100 nm) and the plane in the insulating film away from the interface by 30 nm (point at the depth of 70 m). The average concentration of gallium denotes an average value of SIMS analysis from the interface to 30 nm (i.e., from the depth of 70 nm to 100 nm).

In this table, the variation ΔVfb of the flat band voltage denotes a variation in flat band voltage Vfb relative to the flat band voltage Vfb of the test sample subjected to heat treatment at 400° C. The basis of the variation ΔVfb of the flat band voltage is set to the flat band voltage Vfb of the test sample subjected to heat treatment at 400° C., since heat treatment of the metal layer is required in production of the semiconductor device and the minimum required heat treatment temperature is 400° C. The results of FIG. 6 show that the flat band voltage Vfb decreases with an increase of the gallium concentration in the insulating film.

Figure 7:
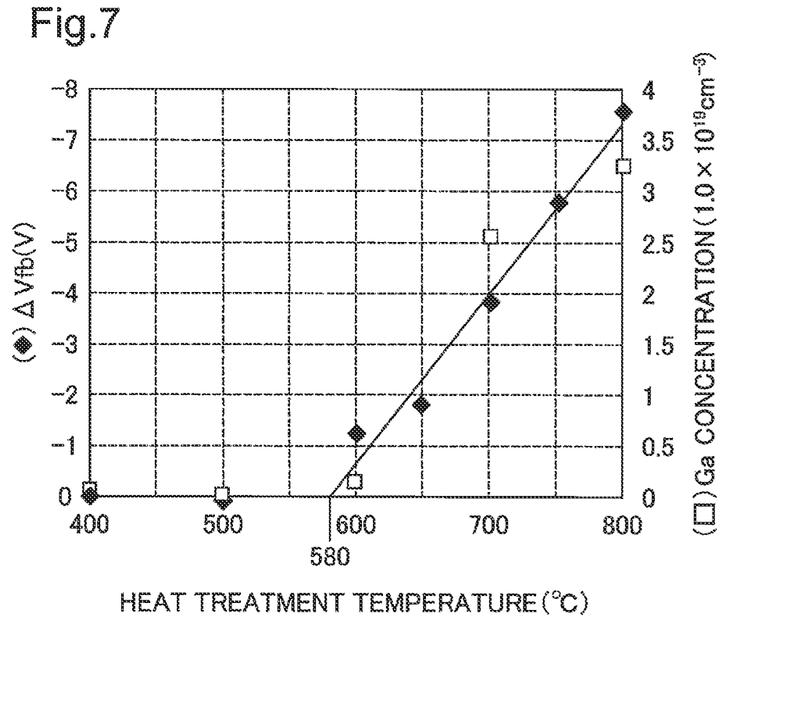
FIG. 7 is a graph showing the relationship between the gallium concentration in the insulating film and the variation in flat band voltage Vfb with regard to the respective heat treatment temperatures.

FIG. 7 is a graph showing the relationship between the gallium concentration in the insulating film and the variation in flat band voltage Vfb with regard to the respective heat treatment temperatures. FIG. 7 shows the heat treatment temperature as abscissa and the gallium concentration in the insulating film and the variation ΔVfb in flat band voltage as ordinate. The gallium concentration in the insulating film and the variation ΔVfb in flat band voltage Vfb shown in FIG. 7 are identical with those shown in FIG. 6.

In the graph of FIG. 7, the gallium concentration in the insulating film and the flat band voltage Vfb are dependent on the heat treatment temperature and are correlated to the heat treatment temperature. The result of the test sample subjected to heat treatment at 600° C. shows that diffusion of gallium from the interface of the insulating film and the semiconductor substrate to about 30 nm decreases the flat band voltage Vfb.

The graph of FIG. 7 also includes an approximate line for the variation ΔVf of the flat band voltage at the respective heat treatment temperatures. In this approximate line, the variation ΔVf of the flat band voltage is equal to 0 V at a heat treatment temperature of 580° C. It is accordingly preferable to set the heat treatment temperature to be not higher than 580° C., in terms of suppressing the decrease of the flat band voltage Vfb.

In this approximate line, the gallium concentration at the heat treatment temperature of 580° C. is $1.75 \times 10^{17}$ cm$^{-3}$. In terms of suppressing the decrease of the flat band voltage Vfb, it is preferable to control the average concentration of gallium in the insulating film between the interface of the insulating film and the semiconductor substrate and the plane away from the interface by 30 nm to be not higher than $1.75 \times 10^{17}$ cm$^{-3}$. Suppressing the decrease of the flat band voltage Vfb is equivalent to suppressing the decrease of the threshold voltage Vth.

The precise mechanism how diffusion of gallium into the insulating film causes the decrease of the flat band voltage Vb is unknown. But this may be attributed to ionization of gallium (Ga) in silicon dioxide (SiO$_2$) and formation of gallium oxide (GaO) to behave like the n-type semiconductor.

C. Other Embodiments

C1. Second Embodiment

Figure 8:
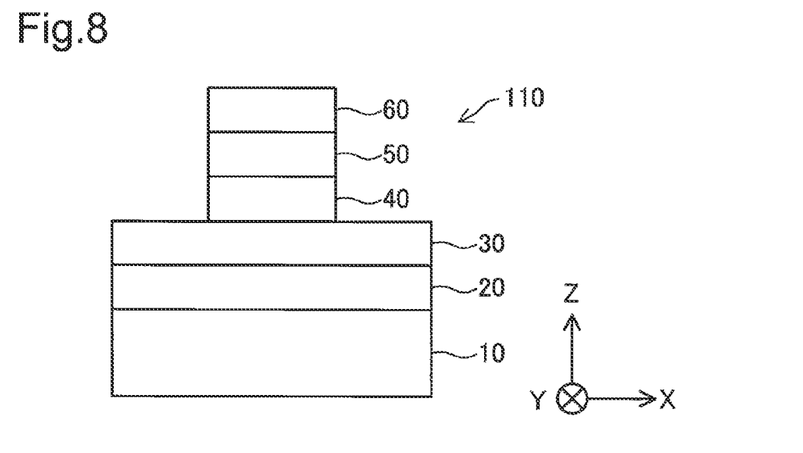
FIG. 8 is a diagram schematically illustrating the structure of a semiconductor device according to a second embodiment.

FIG. 8 is a diagram schematically illustrating the structure of a semiconductor device 110 according to a second embodiment. The semiconductor device 110 of the second embodiment is an MIS diode. The semiconductor device 110 differs from the semiconductor device 100 of the first embodiment by the presence of a second insulating film 30 and a third metal layer 60 but is otherwise similar to the semiconductor device 100 of the first embodiment.

The second insulating film 30 of the semiconductor device 110 is provided between the first insulating film 20 and the first metal layer 40. The second insulating film 30 is located on an opposite side of the first insulating film 20 to the semiconductor layer 10 and is made of a different material from the material of the first insulating film 20. The second insulating film 30 preferably has a higher permittivity than the first insulating film 20. This is more like to induce the carrier in the semiconductor layer 10 that is in contact with the first insulating film 20.

The second insulating film 30 may be made of at least one selected from the group consisting of zirconium oxide, zirconium oxynitride, hafnium oxide and hafnium oxynitride. The second insulating film 30 may be made of at least one selected from the group consisting of aluminum oxide, aluminum nitride and aluminum oxynitride. According to this embodiment, the second insulating film 30 is made of zirconium oxide.

The third metal layer 60 of the semiconductor device 110 is located on an opposite side of the second metal layer 50 to the semiconductor layer 10. The third metal layer 60 is made of titanium nitride (TiN). Like the first metal layer 40, according to this embodiment, the composition ratio of nitrogen to titanium (nitrogen/titanium) of the third metal layer 60 is between 0.88 and 0.98, inclusive. Such composition ratio suppresses a variation in flat band voltage Vfb according to a variation in thickness of the titanium nitride layer.

C2. Third Embodiment

Figure 9:
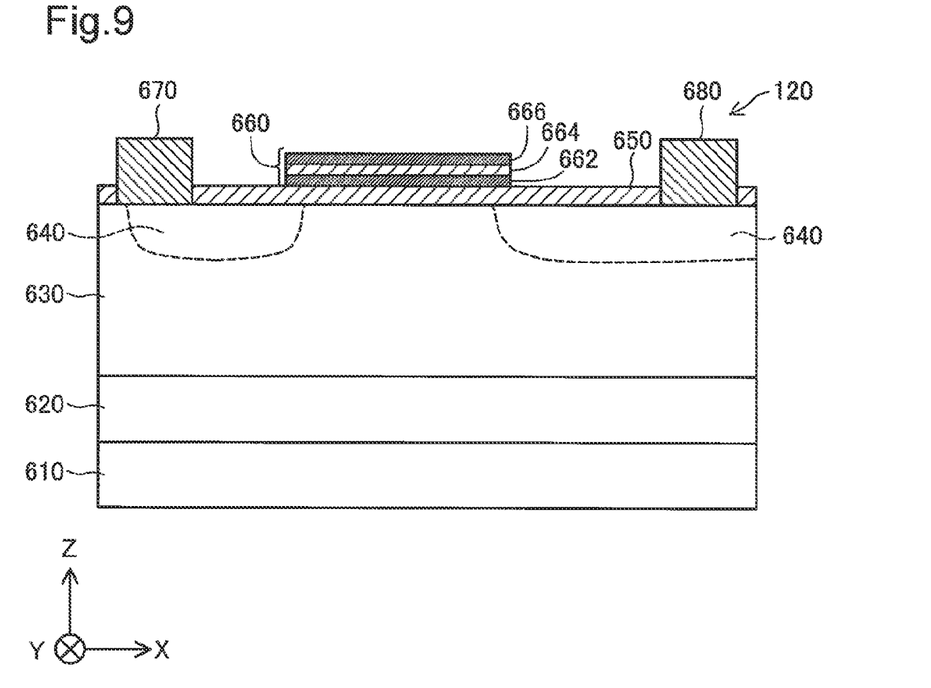
FIG. 9 is a diagram schematically illustrating the structure of a semiconductor device according to a third embodiment.

FIG. 9 is a diagram schematically illustrating the structure of a semiconductor device 120 according to a third embodiment. The semiconductor device 120 of the third embodiment is an MIS-type FET (field effect transistor). In other words, the semiconductor device 120 is an insulating gate-type field effect transistor.

The semiconductor device 120 includes a substrate 610, a buffer layer 620, a p-type semiconductor layer 630, n+-type semiconductor regions 640, a gate insulating film 650, a gate electrode 660, a source electrode 670 and a drain electrode 680.

The substrate 610 of the semiconductor device 120 is made of sapphire. The buffer layer 620 is a layer formed on the substrate 610 by MOCVD (metal organic chemical vapor deposition). The p-type semiconductor layer 630 is a layer that is made of gallium nitride (GaN) and contains an acceptor element. The n+-type semiconductor regions 640 are regions formed by ion implantation into the p-type semiconductor layer 630.

The gate insulating film 650 is an insulating layer that is in contact with the p-type semiconductor layer 630 and contains silicon. According to this embodiment, the gate insulating film 650 is made of silicon dioxide (SiO$_2$).

According to this embodiment, the gate electrode 660 includes a titanium nitride layer 662, an aluminum alloy layer 664 and a titanium nitride layer 666 sequentially formed from the gate insulating film 650-side. According to this embodiment, the p-type semiconductor layer 630, the gate insulating film 650 and the gate electrode 660 constitute the MIS structure. In other words, the gate electrode 660 forms at least part of the MIS structure.

The source electrode 670 and the drain electrode 680 are formed to pass through the gate insulating film 650 and to be in contact with the n+-type semiconductor regions 640. The source electrode 670 is an electrode obtained by stacking a layer made of aluminum (Al) on a layer made of titanium (Ti) and heat treating the stacked layers. Similarly, the drain electrode 680 is an electrode obtained by stacking a layer made of aluminum (Al) on a layer made of titanium (Ti) and heat treating the stacked layers.

Forming an n-type inversion layer in an area of the p-type semiconductor layer 630 immediately below the gate electrode 660 by an electric field causes electric current to flow in the semiconductor device 120.

C3. Fourth Embodiment

Figure 10:
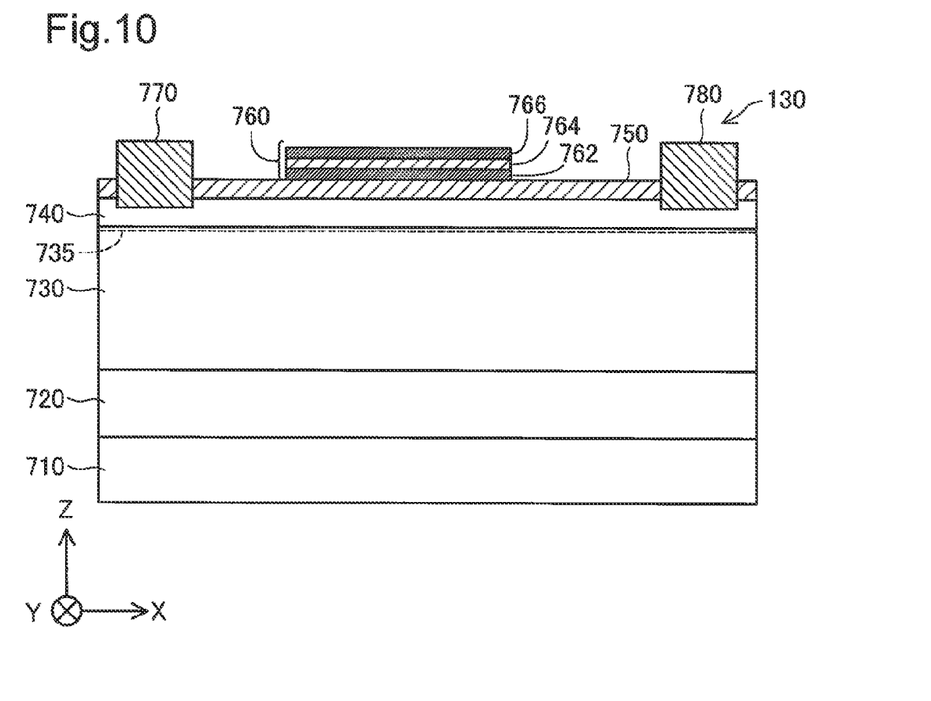
FIG. 10 is a diagram schematically illustrating the structure of a semiconductor device according to a fourth embodiment.

FIG. 10 is a diagram schematically illustrating the structure of a semiconductor device 130 according to a fourth embodiment. The semiconductor device 130 of the fourth embodiment is an MIS-type FET having heterojunction. In other words, the semiconductor device 130 is an insulating gate-type field effect transistor.

The semiconductor device 130 includes a substrate 710, a buffer layer 720, a semiconductor layer 730, a barrier layer 740, a gate insulating film 750, a gate electrode 760, a source electrode 770 and a drain electrode 780.

The substrate 710 and the buffer layer 720 of the semiconductor device 130 are respectively the same as the substrate 610 and the buffer layer 620 of the third embodiment. The semiconductor layer 730 is a layer made of gallium nitride (GaN). The barrier layer 740 is a layer made of aluminum gallium nitride (AlGaN).

According to this embodiment, the barrier layer 740 is stacked on the semiconductor layer 730 and is made of a different material from the material of the semiconductor layer 730. Accordingly, the joint between the semiconductor layer 730 and the barrier layer 740 is heterojunction. A two-dimensional electron gas 735 is present at an interface of the semiconductor layer 730 and the barrier layer 740.

The gate insulating film 750, the gate electrode 760, the source electrode 770 and the drain electrode 780 of the semiconductor device 130 are respectively made of the same materials as those of the gate insulating film 650, the gate electrode 660, the source electrode 670 and the drain electrode 680 of the third embodiment. The gate electrode 760 includes a titanium nitride layer 762, an aluminum alloy layer 764 and a titanium nitride layer 766 sequentially formed from the gate insulating film 750-side.

The source electrode 770 and the drain electrode 780 are formed to pass through the gate insulating film 750 and to be in contact with the barrier layer 740. The semiconductor device 130 of the embodiment is a normally-on type (depression type) since the two-dimensional electron gas 735 is present between the source electrode 770 and the drain electrode 780.

C4. Fifth Embodiment

Figure 11:
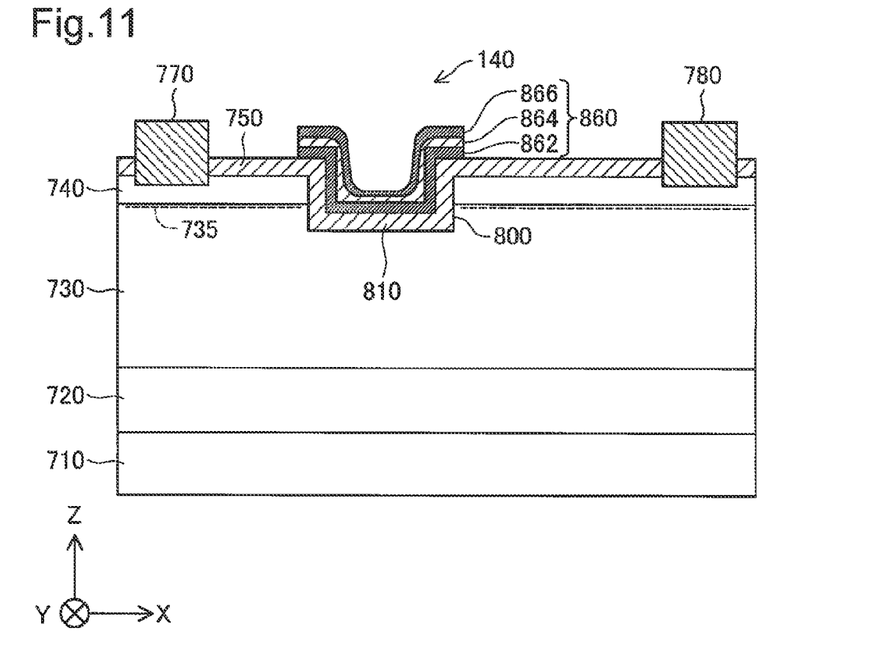
FIG. 11 is a diagram schematically illustrating the structure of a semiconductor device according to a fifth embodiment.

FIG. 11 is a diagram schematically illustrating the structure of a semiconductor device 140 according to a fifth embodiment. The semiconductor device 140 of the fifth embodiment is an MIS-type FET having the trench structure in the channel. In other words, the semiconductor device 140 is an insulating gate-type field effect transistor.

The semiconductor device 140 of the fifth embodiment differs from the semiconductor device 130 of the fourth embodiment by the presence of a trench 800 and a gate insulating film 810 and a gate electrode 860 stacked on a bottom face and a side face of the trench 800, but is otherwise similar to the semiconductor device 130 of the fourth embodiment. The MIS structure is thus also formed on the wall of the trench structure. The gate electrode 860 includes a titanium nitride layer 862, an aluminum alloy layer 864 and a titanium nitride layer 866 sequentially formed from the gate insulating film 810-side.

The trench 800 is a groove extended along a Z-axis direction on the surface of the semiconductor device 140. The trench 800 is formed to pass through the barrier layer 740 and to reach the semiconductor layer 730. The two-dimensional electron gas 735 between the source electrode 770 and the drain electrode 780 is interrupted by the trench 800. Accordingly, the semiconductor device 140 of this embodiment is an normally-off type (enhancement type).

C5. Sixth Embodiment

Figure 12:
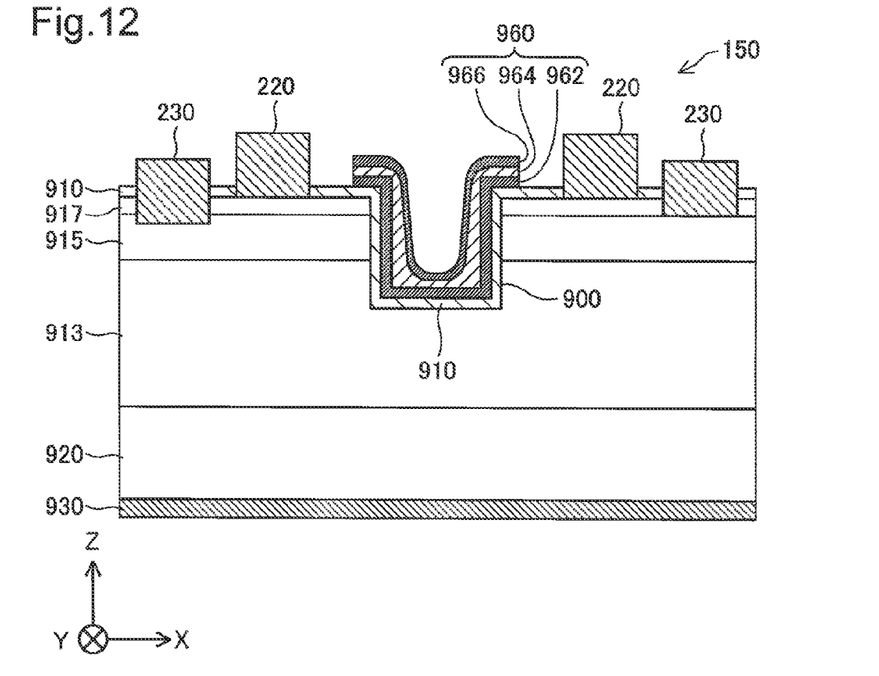
FIG. 12 is a diagram schematically illustrating the structure of a semiconductor device according to a sixth embodiment.

FIG. 12 is a diagram schematically illustrating the structure of a semiconductor device 150 according to a sixth embodiment. The semiconductor device 150 of the sixth embodiment is a trench-type vertical MISFET. In other words, the semiconductor device 150 is a vertical transistor and is an insulating gate-type field effect transistor.

The semiconductor device 150 includes a substrate 920, an n-type semiconductor layer 913, a p-type semiconductor layer 915, an n+-type semiconductor layer 917, an insulating film 910, a trench 900, a gate electrode 960 provided in the trench, source electrodes 220, 220, p-body electrodes 230, 230 and a drain electrode (rear face electrode) 930.

The substrate 920 has a plate-like shape extended in an X-axis direction and a Y-axis direction. The n-type semiconductor layer 913 is formed on the substrate 920. The p-type semiconductor layer 915 is formed on the n-type semiconductor layer 913. The n+-type semiconductor layer 917 is formed on the p-type semiconductor layer 915. The substrate 920, the n+-type semiconductor layer 917, the p-type semiconductor layer 915 and the n-type semiconductor layer 913 are layers mainly made of GaN.

The trench 900 is a groove extended along a Z-axis direction on the surface of the semiconductor device 150. The trench 900 is formed to pass through the n+-type semiconductor layer 917 and the p-type semiconductor layer 915 and to reach the n-type semiconductor layer 913. The insulating film 910 is stacked on a side face and a bottom face of the trench 900 in the n+-type semiconductor layer 917, the p-type semiconductor layer 915 and the n-type semiconductor layer 913. The gate electrode 960 is stacked on the insulating film 910. The gate electrode 960 includes a titanium nitride layer 962, an aluminum alloy layer 964 and a titanium nitride layer 966 sequentially formed from the insulating film 910-side.

In the semiconductor device 150, the source electrodes 220, 220 are formed on both side of the gate electrode 960. The source electrodes 220, 220 are respectively formed to pass through the insulating film 910 and to be connected with the n+-type semiconductor layer 917.

Additionally, the p-body electrodes 230, 230 are formed on opposite sides of the respective source electrodes 220, 220 to the gate electrode 960. The p-body electrodes 230, 230 are respectively formed to pass through the insulating film 910 and the n+-type semiconductor layer 917 and to be connected with the p-type semiconductor layer 915.

The drain electrode (rear face electrode) 930 is provided on a lower surface (−Z-side surface) of the substrate 920 or more specifically on an opposite side of the substrate 920 to the n-type semiconductor layer 913. The semiconductor device 140 of this embodiment is a normally-off type (enhancement type).

The "semiconductor layer 730" and the "barrier layer 740" of the above embodiment respectively correspond to the "first semiconductor layer" and the "second semiconductor layer" in Summary. The "process P110" and the "process P130" of the above embodiment respectively correspond to the "first process" and the "second process" in Summary.

D. Modifications

The invention is not limited to any of the embodiments, the examples and the modifications described above but may be implemented by a diversity of other configurations without departing from the scope of the invention. For example, the technical features of any of the embodiments, examples and modifications corresponding to the technical features of each of the aspects described in Summary may be replaced or combined appropriately, in order to solve part or all of the problems described above or in order to achieve part or all of the advantageous effects described above. Any of the technical features may be omitted appropriately unless the technical feature is described as essential herein.

The above embodiment employs ICP-RIE for dry etching, but this is not restrictive. Another dry etching technique, for example, ECR-RIE (electron cyclotron resonance-reactive ion etching) may be employed.

The semiconductor device which the present invention is applied to is not limited to the semiconductor devices described in the above embodiments but may be any semiconductor device including a semiconductor layer that is made of a gallium-containing group III-V compound and an insulating film that is in contact with the semiconductor layer and contains silicon. Other examples of such semiconductor device include insulated gate bipolar transistor (IGBT) and a schottky barrier diode. The schottky barrier diode may be configured such that a schottky gate electrode is provided to be in contact with a semiconductor layer and that an insulating film is provided as a protective film.

The invention claimed is:

1. A semiconductor device, comprising
a semiconductor layer that is made of a gallium-containing group III-V compound; and
a first insulating film that is in contact with the semiconductor layer and contains silicon, wherein
an average density of gallium in the first insulating film between an interface of the first insulating film and the semiconductor layer and a plane away from the interface by 30 nm is less than $1.0\times10^{18}$ cm$^{-3}$.

2. The semiconductor device according to claim 1, wherein the semiconductor layer is made of a gallium-containing group III nitride.

3. The semiconductor device according to claim 1, wherein the first insulating film is made of at least one selected from the group consisting of silicon oxide, silicon nitride and silicon oxynitride.

4. The semiconductor device according to claim 1, wherein an interface state density at an interface of the semiconductor layer and the first insulating film is not higher than $3.0\times10^{11}$ cm$^{-2}$eV$^{-1}$.

5. The semiconductor device according to claim 1, further comprising
a second insulating film that is provided on an opposite side of the first insulating film to the semiconductor layer and is made of a different material from material of the first insulating film.

6. The semiconductor device according to claim 5, wherein the second insulating film has a higher permittivity than the first insulating film.

7. The semiconductor device according to claim 5, wherein the second insulating film is made of at least one selected from the group consisting of zirconium oxide, zirconium oxynitride, hafnium oxide and hafnium oxynitride.

8. The semiconductor device according to claim 5, wherein the second insulating film is made of at least one selected from the group consisting of aluminum oxide, aluminum nitride and aluminum oxynitride.

9. The semiconductor device according to claim 1, further comprising
a first metal layer provided on an opposite side of the first insulating layer to the semiconductor layer, so as to form an MIS structure.

10. The semiconductor device according to claim 9, wherein the first metal layer is made of titanium nitride and has a composition ratio of nitrogen to titanium (nitrogen/titanium) between 0.88 and 0.98, inclusive.

11. The semiconductor device according to claim 9, further comprising
a second metal layer provided on an opposite side of the first metal layer to the semiconductor layer, and the second metal layer is made of an aluminum alloy.

12. The semiconductor device according to claim 11, further comprising
a third metal layer provided on an opposite side of the second metal layer to the semiconductor layer, and the third metal layer is made of titanium nitride.

13. The semiconductor device according to claim 9, the semiconductor device being an insulating gate-type field effect transistor, in which a gate electrode forms at least part of the MIS structure.

14. The semiconductor device according to claim 13, further comprising
a trench, wherein
the MIS structure is formed on a wall of the trench.

15. The semiconductor device according to claim 13, the semiconductor device being a vertical transistor.

16. The semiconductor device according to claim 9, wherein the semiconductor layer includes
a first semiconductor layer, and
a second semiconductor layer that is stacked on the first semiconductor layer and is made of a different material from material of the first semiconductor layer, wherein
a two-dimensional electron gas is present at an interface of the first semiconductor layer and the second semiconductor layer.

* * * * *